(12) United States Patent
Delperier et al.

(10) Patent No.: US 9,845,534 B2
(45) Date of Patent: Dec. 19, 2017

(54) CVI DENSIFICATION INSTALLATION INCLUDING A HIGH CAPACITY PREHEATING ZONE

(71) Applicant: HERAKLES, Le Haillan (FR)

(72) Inventors: Bernard Delperier, Merignac (FR); Jean-François Potin, Merignac (FR); Sophie Soulignac, Le Pian Medoc (FR)

(73) Assignee: HERAKLES, Le Haillan (FR)

( * ) Notice: Subject to any disclaimer, the term of this patent is extended or adjusted under 35 U.S.C. 154(b) by 0 days.

(21) Appl. No.: 15/125,854

(22) PCT Filed: Mar. 5, 2015

(86) PCT No.: PCT/FR2015/050546
§ 371 (c)(1),
(2) Date: Sep. 13, 2016

(87) PCT Pub. No.: WO2015/136193
PCT Pub. Date: Sep. 17, 2015

(65) Prior Publication Data
US 2017/0002466 A1 Jan. 5, 2017

(30) Foreign Application Priority Data
Mar. 14, 2014 (FR) ...................................... 1452151

(51) Int. Cl.
*C23C 16/46* (2006.01)
*C23C 16/458* (2006.01)
(Continued)

(52) U.S. Cl.
CPC ................. *C23C 16/46* (2013.01); *B01J 6/00* (2013.01); *B01J 8/0285* (2013.01); *C04B 35/80* (2013.01);
(Continued)

(58) Field of Classification Search
CPC . C23C 16/46; C23C 16/4557; C23C 16/4583; C23C 16/045; C23C 16/452;
(Continued)

(56) References Cited

U.S. PATENT DOCUMENTS 5,362,228 A 11/1994 Vaudel
5,480,678 A 1/1996 Rudolph et al.
(Continued)

OTHER PUBLICATIONS

International Preliminary Report on Patentability and the Written Opinion of the International Searching Authority as issued in International Patent Application No. PCT/FR2015/050546, dated Sep. 14, 2016.
(Continued)

*Primary Examiner* — Jeffrie R Lund
(74) *Attorney, Agent, or Firm* — Pillsbury Winthrop Shaw Pittman LLP

(57) ABSTRACT

A thermochemical treatment installation includes a reaction chamber, at least one gas inlet, and a gas preheater chamber situated between the gas inlet and the reaction chamber. The preheater chamber has a plurality of perforated distribution trays held spaced apart one above another. The preheater chamber also includes, between at least the facing distribution trays, a plurality of walls defining flow paths for a gas stream between said trays.

13 Claims, 5 Drawing Sheets

(51) Int. Cl.
*C23C 16/455* (2006.01)
*F28C 3/00* (2006.01)
*C04B 35/80* (2006.01)
*B01J 6/00* (2006.01)
*B01J 8/02* (2006.01)
*F28F 13/06* (2006.01)
*C23C 16/452* (2006.01)
*F27B 5/16* (2006.01)
*F27D 7/06* (2006.01)
*C23C 16/04* (2006.01)
*F27D 99/00* (2010.01)
*F28F 3/08* (2006.01)
*F28D 21/00* (2006.01)

(52) U.S. Cl.
CPC .......... *C23C 16/045* (2013.01); *C23C 16/452* (2013.01); *C23C 16/4557* (2013.01); *C23C 16/4583* (2013.01); *C23C 16/45591* (2013.01); *F27B 5/16* (2013.01); *F27D 7/06* (2013.01); *F27D 99/0001* (2013.01); *F28C 3/005* (2013.01); *F28F 3/086* (2013.01); *F28F 13/06* (2013.01); *B01J 2208/00407* (2013.01); *B01J 2208/00415* (2013.01); *B01J 2208/00433* (2013.01); *B01J 2208/00469* (2013.01); *B01J 2208/00884* (2013.01); *B01J 2208/00938* (2013.01); *B01J 2219/00006* (2013.01); *C04B 2235/425* (2013.01); *C04B 2235/5268* (2013.01); *F28D 2021/0022* (2013.01)

(58) Field of Classification Search
CPC ...... C23C 16/45591; F28C 3/005; B01J 6/00; B01J 8/0285; B01J 2208/00433; B01J 2219/00006; B01J 2208/00884; B01J 2208/00469; B01J 2208/00407; B01J 2208/00415; B01J 2208/00938; F28F 3/086; F28F 13/06; F27D 7/06; F27D 99/0001; C04B 2235/425; C04B 35/80; C04B 2235/5268; F28D 2021/0022; F27B 5/16

See application file for complete search history.

(56) References Cited

U.S. PATENT DOCUMENTS

| | | | |
|---|---|---|---|
| 5,904,957 A | 5/1999 | Christin et al. | |
| 6,062,851 A * | 5/2000 | Rudolph | C23C 16/045 432/237 |
| 6,162,298 A * | 12/2000 | Rudolph | C23C 16/045 118/715 |
| 6,572,371 B1 * | 6/2003 | Sion | C23C 16/26 118/724 |
| 6,639,196 B1 * | 10/2003 | Fiala | C23C 16/045 118/724 |
| 2003/0118728 A1 * | 6/2003 | Sion | C04B 35/83 427/249.2 |
| 2004/0237898 A1 * | 12/2004 | Bernard | C04B 35/83 118/724 |
| 2005/0129593 A1 * | 6/2005 | Hotta | B01D 53/74 422/198 |
| 2008/0124462 A1 * | 5/2008 | Waghray | C04B 35/83 427/249.2 |
| 2009/0053413 A1 * | 2/2009 | Chang | C04B 35/632 427/248.1 |
| 2010/0248056 A1 * | 9/2010 | Yaguchi | H01M 8/04007 429/434 |
| 2017/0002466 A1 * | 1/2017 | Delperier | C23C 16/045 |

OTHER PUBLICATIONS

International Search Report as issued in International Patent Application No. PCT/FR2015/050546, dated Jun. 12, 2015.

* cited by examiner

CVI DENSIFICATION INSTALLATION INCLUDING A HIGH CAPACITY PREHEATING ZONE

CROSS-REFERENCE TO RELATED APPLICATIONS

This is the U.S. National Stage of PCT/FR2015/050546, filed Mar. 5, 2015, which in turn claims priority to French Patent Application No. 1452151, filed Mar. 14, 2014, the entire contents of all applications are incorporated herein by reference in their entireties.

BACKGROUND OF THE INVENTION

The invention relates to installations or ovens used for performing heat treatment, and in which the gas used in the treatment is preheated prior to being introduced into the treatment chamber of the installation. Such installations are used in particular for performing thermochemical treatments, such as carburizing parts or densifying porous substrates by chemical vapor infiltration.

A field of application of the invention is that of making parts out of thermostructural composite material, i.e. out of composite material that possesses both mechanical properties that make it suitable for constituting structural parts and also the ability to conserve those properties up to high temperatures. Typical examples of thermostructural composite materials are carbon/carbon (C/C) composites have a reinforcing fabric of carbon fibers densified by a matrix of pyrolytic carbon, and ceramic matrix composites (CMC) having a reinforcing fabric of refractory fibers (carbon or ceramic) densified by a ceramic matrix.

A well-known method for densifying porous substrates in order to make C/C or CMC composite parts is chemical vapor infiltration (CVI). The substrates for densifying are placed in a loading zone of an installation in Which they are heated. A reactive gas containing one or more gaseous precursors of the material constituting the matrix is introduced into the oven. The temperature and the pressure inside the installation are adjusted so as to enable the reactive gas to diffuse within the pores of the substrates and deposit therein the material constituting the matrix as a result of one or more of the components of the reactive gas decomposing or as a result of a reaction between a plurality of components, these components forming the precursor of the matrix. The process is performed under low pressure so as to encourage the reactive gas to diffuse within the substrates. The temperature of the transformation of the precursor(s) in order to form the matrix material, such as pyrolytic carbon or ceramic, usually lies in the range 900° C. to 1100° C., but this temperature may nevertheless be as high as 2000° C. for a massive deposit of pyrolytic carbon by chemical vapor deposition (CVD).

In order to perform densification that is as uniform as possible in the substrates throughout the loading zone, whether this be measured in terms of increase in density or in terms of the microstructure of the matrix material that is formed, it is necessary for the reactive gas to penetrate into the loading zone at a temperature that is as low as possible and uniform.

Thus, installations conventionally include means for preheating the gas. Such preheater means may be situated at the periphery of the installation, i.e. on the path of the gas before it enters into the treatment enclosure of the installation. Such preheater means increase the complexity and the overall size of the installation.

In order to avoid those drawbacks, it is known to provide the installation with a zone or chamber for preheating the reactive gas that is situated between the inlet for the reactive gas into the installation and the loading zone. Typically, the preheater zone comprises a plurality of perforated trays through which the reactive gas passes.

The gas preheater trays, like the substrates, are heated as a result of being present in the installation. The installation is generally heated by induction or by electrical means such as resistor elements housed in the wall of the installation.

Nevertheless, although the preheater chamber enables the reactive gas to be heated prior to being introduced into the loading zone, it is difficult to control the temperature of the reactive gas in the preheater chamber so that it is uniform radially, in particular in installations of large diameter.

In order to solve that problem, it might be thought that the effectiveness with which the gas is preheated could be increased by enlarging the preheater zone, in particular by increasing its volume vertically, even though that is to the detriment of the volume of the loading zone for an installation of unchanging total volume. Unfortunately, treatments such as chemical vapor infiltration processes require investments that are expensive on an industrial scale, and they take a long time to perform. It is therefore very desirable for installations to have a high level of productivity, regardless of whether they are installations that are already in service or new installations that are yet to be made, and thus for them to have a ratio that is as great as possible between the working volume dedicated to being loaded with substrates or parts for treatment, and the volume that is dedicated to heating the reactive gas.

OBJECT AND SUMMARY OF THE INVENTION

An object of the invention is to propose a design for a thermochemical treatment installation that enables a gas stream to be preheated to a determined temperature while minimizing temperature differences between the center and the periphery of the installation at the outlet from the preheater chamber, and to do this without needing to increase its volume in order to enhance the productivity of the installation.

To this end, the present invention provides a thermochemical treatment installation comprising a reaction chamber, at least one gas inlet, and a gas preheater chamber situated between the gas inlet and the reaction chamber, said preheater chamber having a plurality of perforated distribution trays held spaced apart one above another, the installation being characterized in that the preheater chamber also includes, between at least two facing distribution trays, a plurality of walls defining flow paths for a gas stream between said trays, each wall extending vertically between said at least two facing distribution trays.

By using walls between the distribution trays, the heating capacity of the preheater chamber is increased firstly by increasing heat exchange by convection and secondly by lengthening the travel path and consequently the transit time of the gas through the preheater chamber. The uniformity of the temperature profile of the reactive gas leaving the preheater chamber is also improved, and this applies regardless of the diameter of the installation. With the installation of the invention, it is possible to obtain preheating performance that is equivalent or even improved, while using a preheater chamber presenting a volume that is smaller than the volume of a chamber not having such walls. Alternatively, for equal preheater chamber volume, with a preheater chamber having walls of the invention, the performance that is obtained in terms of temperature and uniformity of heating is much improved in comparison with a preheater chamber not having such walls.

According to a characteristic of the installation of the invention, the distribution trays are disk-shaped and least some of the walls extend between said trays in a radial direction. Such an arrangement serves to guide the flow of the gas stream over the entire surface of the trays and thus maximize heat transfer.

According to another characteristic of the installation of the invention, at least some of the walls present an undulating shape, thus making it possible to lengthen the walls, and consequently to lengthen the heat exchange area for the gas stream.

According to another characteristic of the installation of the invention, the walls present thermal conductivity that is greater in a direction parallel to the distribution trays than in a direction perpendicular to said perforated trays. This makes it possible to define anistropic heat conduction between the distribution trays, thereby creating partial thermal decoupling between the cold portion of the installation and the loading zone, while also increasing the heating capacity of the preheater chamber. Under such circumstances, the walls may be made of graphite or of composite material having fiber reinforcement densified by a matrix, with the reinforcing fibers extending for the most part in a direction parallel to the distribution trays.

According to another characteristic of the installation of the invention, the number of walls is greater in the vicinity of the peripheries of the distribution trays than in the centers of said trays. This optimizes the distribution of the walls between the trays and further increases the heat exchange area for the gas stream.

According to another characteristic of the installation of the invention, it includes a loading tray present above the distribution trays of the preheater chamber, said loading tray being supported by columns passing through the distribution trays. This provides decoupling between the mechanical and thermal functions in the preheater chamber.

BRIEF DESCRIPTION OF THE DRAWINGS

Other features and advantages of the densification oven in accordance with the invention appear on reading the following description made by way of non-limiting indication with reference to the accompanying drawings, in which.

DETAILED DESCRIPTION OF EMBODIMENTS

The invention applies to any type of installation or oven used for performing heat treatment and in which the gas used in the treatment is preheated in a preheater chamber prior to being introduced into the treatment or loading zone of the installation. Such installations are used in particular for performing thermochemical treatments such as carburizing parts or densifying porous substrates by chemical vapor infiltration.

Figure 1:
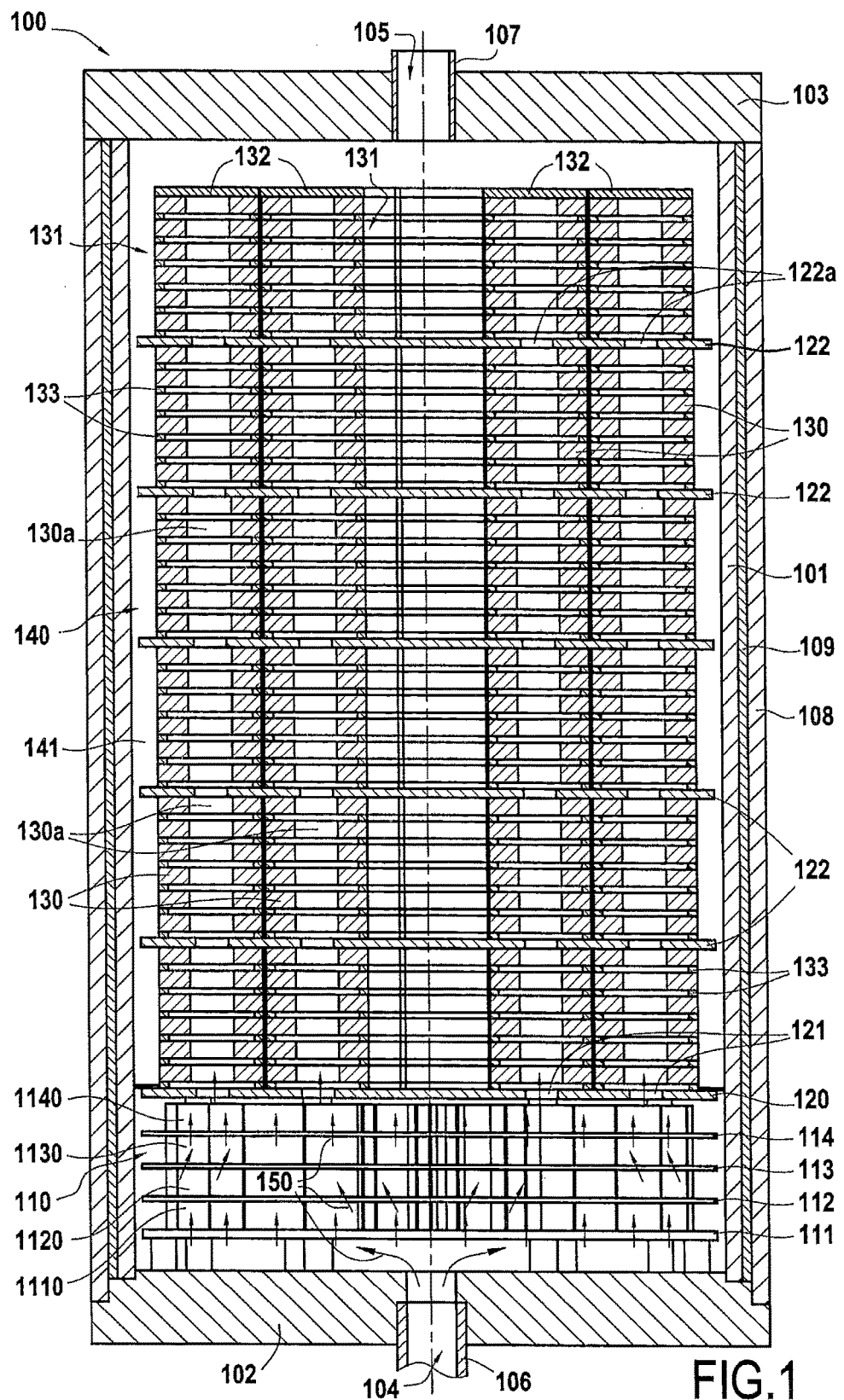
FIG. 1 is a diagrammatic section view of an installation for chemical vapor infiltration in accordance with an embodiment of the invention.

A first embodiment of a densification oven is described with reference to FIGS. 1 to 3. FIG. 1 is a diagram showing an installation 100 for densification by chemical vapor infiltration that is defined by a cylindrical side wall 101, a bottom wall 102, and a top wall 103.

A gas preheater chamber 110, of structure that is described in detail below, extends between the bottom 102 of the oven and a loading tray 120. A pipe 106 connects the reactive gas inlet 104 to the preheater chamber 110 through the bottom 102.

Substrates 130 for densifying are placed in a loading zone or reaction chamber 140 as a plurality of annular vertical stacks 131 supported by the loading tray 120. It has a plurality of passages 121 that are in alignment with the inside volumes 130a of the stacks, and each stack is closed at its top end by a cover 132. The stacks 131 of substrates 130 stand on the loading tray 120 and they may be subdivided into a plurality of superposed sections that are separated by one or more intermediate trays 122 having central passages 122a in alignment with the passages in the substrates 130. Each substrate 130 is separated from an adjacent substrate, or where applicable from an adjacent tray 120, 122 or the cover 132, by spacer wedges 133 that define gaps. The wedges 133, or at least some of them, are arranged so as to leave passages for the gas between the volumes 130a and 141. These passages may be made so as to substantially balance pressure between the volumes 130a and 141, as described in patent U.S. Pat. No. 5,904,957, or so as to constitute simple leakage passages maintaining a pressure gradient between the volumes 130a and 141, as described in patent application EP 0 063 988.

A gas stream 150 containing one or more gaseous precursors of the material constituting the matrix is admitted into the oven through the inlet 104 and it then passes through the preheater chamber 110. The preheated gas is then conveyed via the passages 121 in the loading tray 120 into the inside volumes 130a of the stacks 131. The gas then passes into the volume 38 outside the stack and inside the reaction chamber 140. The effluent gas is extracted via a passage 105 formed in the top wall 103, the passage 105 being connected by a pipe 107 to suction means such as a vacuum pump (not shown).

In a variant embodiment, the internal volumes 130a may be closed at their bottom portions and they may be put into communication at their top portions with the passage 105. The gas stream coming from the preheater chamber 110 is then admitted into the volume 141 of the reaction chamber 140 and the gas flow in this zone takes place from the volume 141 to the volumes 130a, the top portion of the volume 141 being shut off.

In yet another variant, the inlet for the gas stream may be provided through the top wall 103 of the installation, the preheater chamber then being situated in the top portion of the installation, the volumes 130a being in communication with the preheater chamber and being shut off at their bottom portions, while the volume 141 communicates with a gas outlet formed through the bottom wall of the oven, or vice versa.

In the presently-described example, the installation is heated by induction. More precisely, the cylindrical side wall 101 constitutes a susceptor, e.g. made of graphite, that is coupled with an induction winding formed by at least one induction coil 108 situated outside the oven. The installation 109 is interposed between the induction winding 108 and the wall 101. In well-known manner, the oven is heated by the susceptor 101 heating when the induction winding 108 is powered with an alternating current (A/C). For this purpose, coil(s) of the induction winding is/are connected to an AC generator (not shown).

The magnetic field created by the induction winding 108 induces an electric current in the wall 101 (susceptor) that causes it to be heated by the Joule effect, so the elements present inside the wall 101 are subjected to radiant heating.

The installation 100 could be heated by other means, such as electrical heater means constituted by way of example by heater resistance elements embedded in the wall 101.

Figure 2:
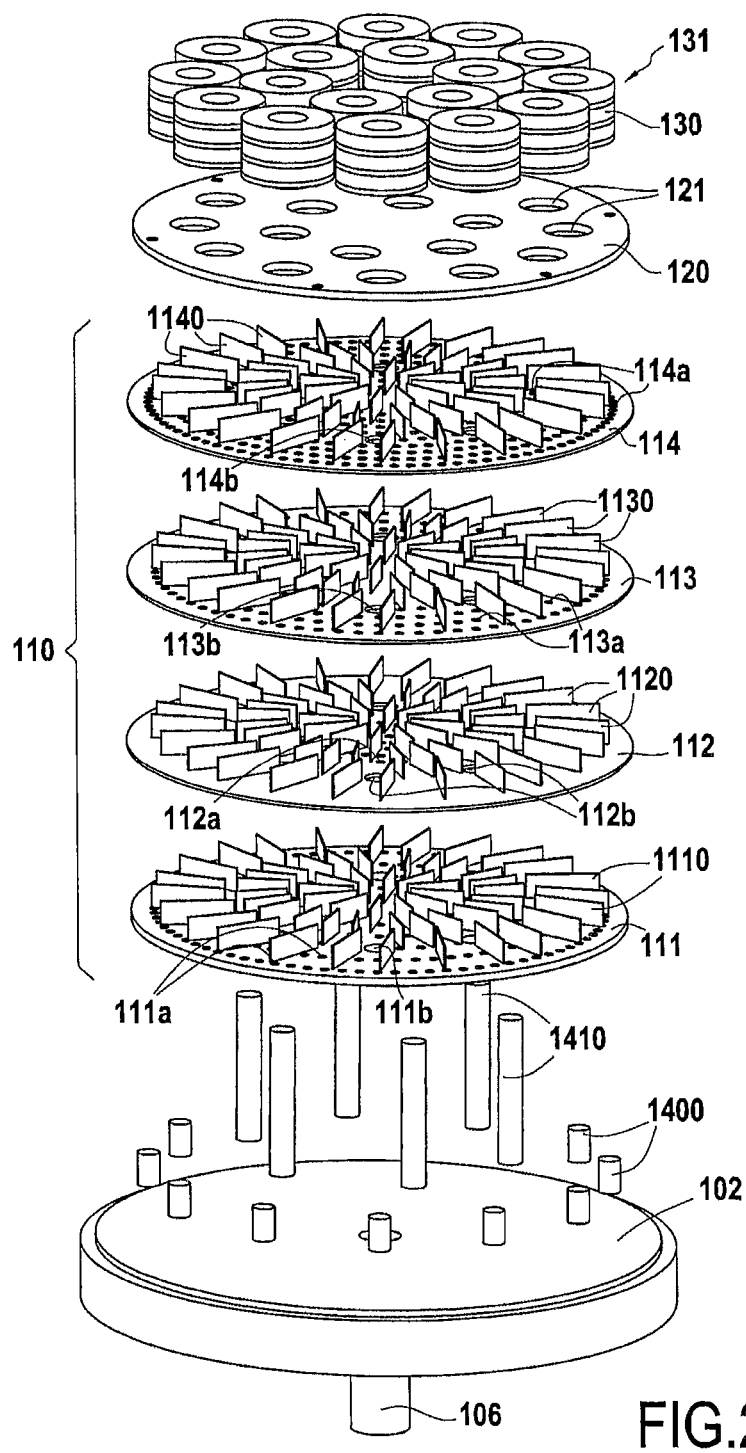
FIG. 2 is an exploded view in perspective showing the component elements of the preheater chamber of the FIG. 1 installation.

The preheater chamber 110 has a plurality of distribution trays, there being four trays 111, 112, 113, and 114 in this example (FIG. 2). Each distribution tray 111, 112, 113, and 114 has a respective plurality of perforations 111a, 112a, 113a, and 114a through which the gas stream 150 flows while it is being preheated (FIG. 1).

In accordance with the invention, walls or deflectors are arranged in the spaces present between the distribution trays. In the presently-described embodiment:
  walls 1110 are arranged between the distribution trays 111 and 112, each wall 1110 being in contact with both of the trays 111 and 112;
  walls 1120 are arranged between the distribution trays 112 and 113, each wall 1120 being in contact with both of the trays 112 and 113; and
  walls 1130 are arranged between the distribution trays 113 and 114, each wall 1130 being in contact with both of the trays 113 and 114.

Furthermore, and still in the presently-described embodiment, walls 1140 are also arranged between the distribution tray 114 and the loading tray 120.

In variant embodiments of the invention, walls or deflectors may be interposed between only a limited number of distribution trays, or indeed between only two distribution trays.

In the presently-described embodiment, the walls 1110, 1120, 1130, and 1140 are plane in shape and extend vertically between the distribution trays, the walls being arranged perpendicularly to the facing surfaces of the trays. The distribution trays 112, 113, and 114 are supported respectively by the walls 1110, 1120, and 1130. The distribution tray 111 is supported by spacers 1400 that extend between the bottom 120 of the installation 100 and the bottom surface of the tray 111.

The loading tray 120 supporting all of the stacks 131 is itself supported by columns 1410 standing on the bottom 102 of the installation 100. The columns 1410 pass through the distribution trays via openings 111b, 112b, 113b, and 114b that are formed respectively in the distribution trays 111, 112, 113, and 114. Thus, in the preheater chamber, the mechanical and thermal functions are separated, the mechanical function of supporting the load being performed by the columns 1410, while the thermal function is performed by the distribution trays 111, 112, 113, and 114 and by the walls 1110, 1120, 1130, and 1140.

The perforations 111a, 112a, 113a, and 114a present respectively in the distribution trays 111, 112, 113, and 114 are preferably positioned at locations that differ between two adjacent trays so as to lengthen the flow path for the gas between the distribution trays. In FIG. 2, the perforations 111a and 113a are positioned in the vicinity of the peripheries of the trays 111 and 113, while the perforations 112a in the tray 112 interposed between the trays 111 and 113 are positioned in the vicinity of the center of the tray 112. The tray 114 that is the last tray in the preheater chamber has perforations 114a over its entire surface.

Figure 3:
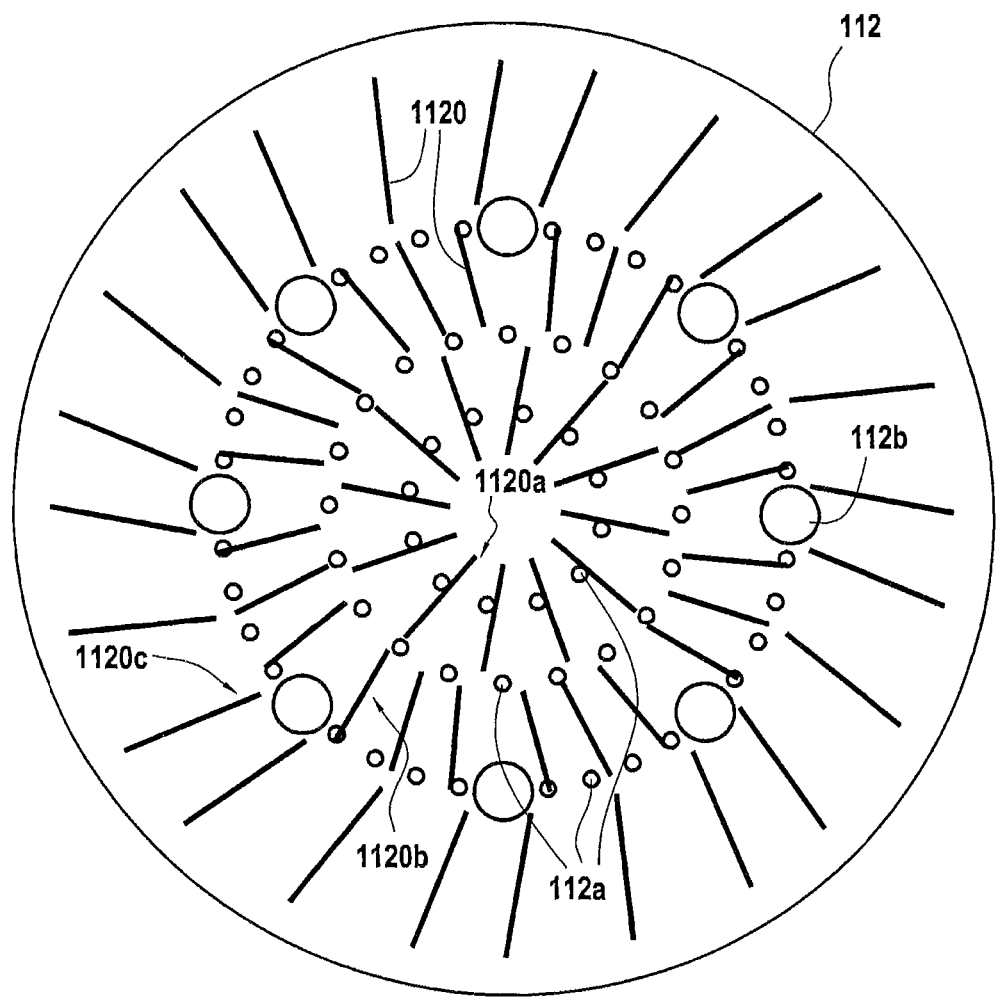
FIG. 3 is a plan view of a distribution tray of the FIG. 2 preheater chamber.

As shown in FIG. 3, the walls 1120 are arranged on the tray 112 in substantially radial directions. This radial arrangement, which also applies to the walls 1110, 1130, and 1140, serves to heat and guide the gas stream 150 penetrating into the space between two distribution trays. In FIG. 3, the walls 1120 serve to guide and heat the gas stream penetrating between the distribution trays 112 and 113 via the perforations 112a in the tray 112. The walls 1110, 1120, 1130, and 1140 thus define respective flow paths for the gas between the trays 111, 112, 113, 114, and 120 flow paths for the gas. The walls 1110, 1120, 1130, and 1140 are made of material that is suitable for heating under the effect of the thermal radiation from the wall 101 of the installation 100 so they serve to increase significantly the heating capacity of the preheater chamber by transferring heat by convection to the gas and by optimizing the flow of said gas within the preheater chamber.

Furthermore, the walls preferably present dimensions that are smaller than the radius of the distribution trays so as to be capable of occupying in optimal manner the space that is present between the distribution trays. In FIG. 3, the walls 1120 are arranged radially in three series, namely a first series 1120a closest to the center of the tray 112, a second series 1120b in an intermediate portion of the tray 112, and a third series 1120c in the vicinity of the periphery of the tray 112. This arrangement is equally applicable to the walls 1110, 1130, and 1140. This radial arrangement as a plurality of series enables a larger number of walls to be installed on going further away from the center of the tray and thus serves to optimize the heat exchange area constituted by the walls. In addition, this radial arrangement as series of walls makes it possible to have discontinuities in the flow paths of the gas stream that serve to optimize its flow.

The walls used in the preheater chamber of the invention are made of materials that have good capacity for transferring heat by convection, such as for example graphite or a refractory metal such as stainless steel or molybdenum. The walls are preferably also made out of a material that presents thermal conductivity in a direction parallel to the distribution trays that is greater than conductivity in a direction perpendicular to said perforated tray. With such materials, anisotropic thermal conduction is defined between the distribution trays that makes it possible to obtain partial thermal decoupling between the cold portion of the installation (bottom wall or top wall of the installation as a function of the position of the preheater chamber) and the loading zone, while still increasing the heating capacity of the preheater chamber. Such materials may in particular be graphite or thermostructural composite material having fiber reinforcement densified by a matrix with the reinforcing fibers oriented for the most part in a direction parallel to the distribution trays.

Figure 4:
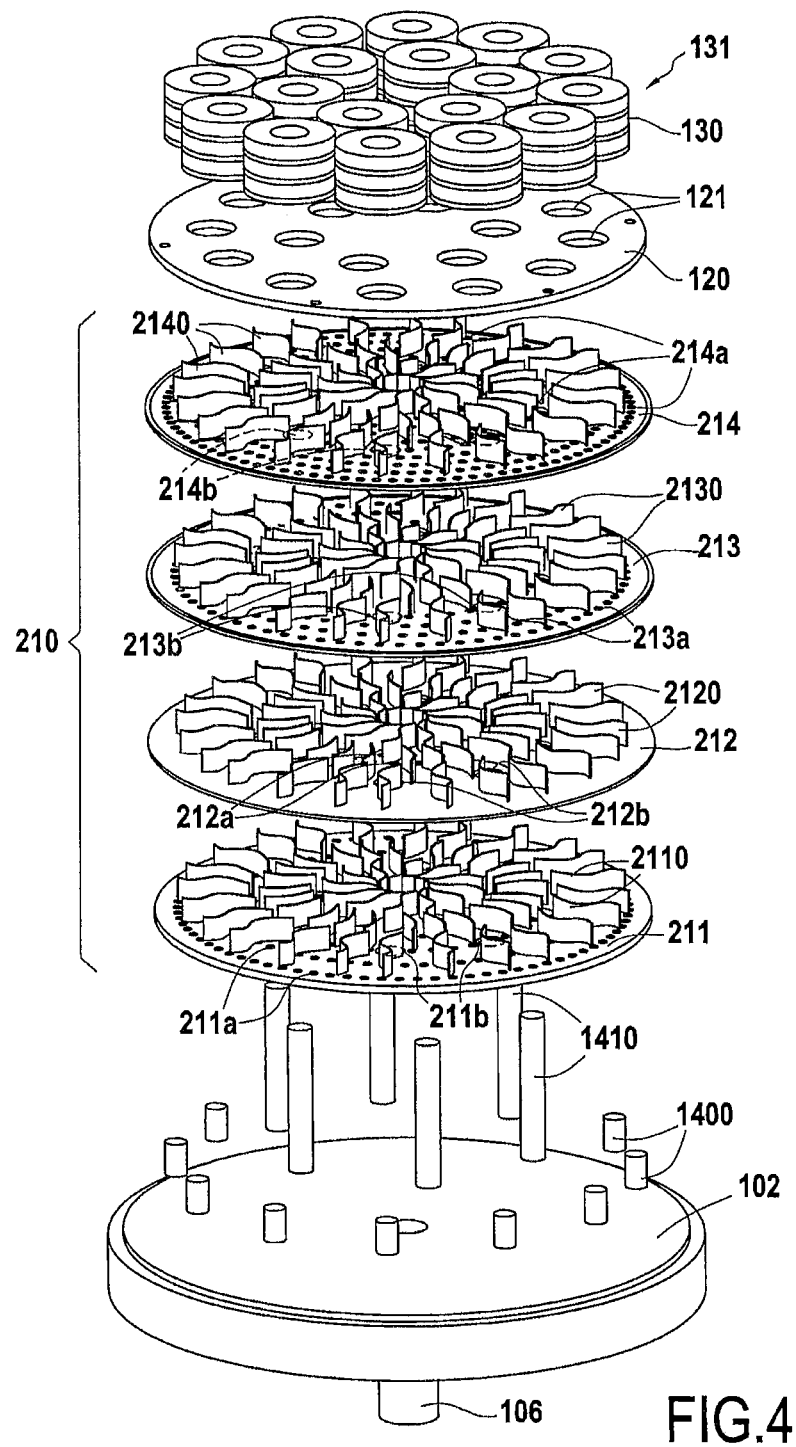
FIG. 4 is an exploded view in perspective showing the component elements of a preheater chamber in accordance with another embodiment of the invention.

FIG. 4 shows a preheater chamber 210 that differs from the above-described preheater chamber 110 in that it uses walls of undulating shape. The preheater chamber 210 is incorporated in the installation 100 for CVI densification in the same manner as the above-described preheater chamber 110. For simplification purposes, elements of the installation 100 that are described above are not described again.

The preheater chamber 210 has a plurality of distribution trays, the four trays 211, 212, 213, and 214 in this example each having a respective plurality of perforations 211a, 212a, 213a, and 214a through which the gas flows while it is being preheated. In accordance with the invention, walls or deflectors are arranged in the spaces present between the distribution trays. In the presently-described embodiment:

walls 2110 are arranged between the distribution trays 211 and 212, each wall 2110 being in contact with both of the trays 211 and 212;

walls 2120 are arranged between the distribution trays 212 and 213, each wall 2120 being in contact with both of the trays 212 and 213; and walls 2130 are arranged between the distribution trays 213 and 214, each wall 2130 being in contact with both of the trays 213 and 214.

Furthermore, still in the presently-described embodiment, walls 2140 are also arranged between the distribution tray 214 and the loading tray 220. In variant embodiments of the invention, walls or deflectors may be interposed between only a limited number of distribution trays, or indeed between only two distribution trays.

In the presently-described embodiment, the walls 2110, 2120, 2130, and 2140 are of undulating shape and they extend vertically between the distribution trays, the walls being arranged perpendicularly to the facing surfaces of the trays. This undulating shape for the walls serves to lengthen the walls in comparison with walls of plane shape such as the above-described walls 1110, 1120, 1130, and 1140, and consequently serves to increase the heat exchange surface area with the gas as it passes through the preheater chamber 210.

The distribution trays 212, 213, and 214 are supported respectively by the walls 2110, 2120, and 2130. The distribution tray 211 is supported by the spacers 1400 that extend between the bottom 102 of the installation 100 and the bottom surface of the tray 111.

The loading tray 120 carrying all of the stacks 131 is supported by columns 1410 that stand on the bottom wall 102 of the installation 100. The columns 1410 pass through the distribution trays via openings 211b, 212b, 213b, and 214b provided through the respective distribution trays 211, 212, 213, and 214. In the preheater chamber, this serves to separate mechanical and thermal functions, the mechanical function of supporting the load is provided by the columns 1410, while the thermal function is performed by the distribution trays 211, 212, 213, and 214 and by the walls 2110, 2120, 2130, and 2140.

The perforations 211a, 212a, 213a, and 214a present respectively in the distribution trays 211, 212, 213, and 214 are preferably positioned at different locations between two adjacent trays so as to lengthen the flow path of the gas between the distribution trays. In FIG. 4, the perforations 211a, 212a, 213a, and 214a are positioned respectively in the same manner as the above-described perforations 111a, 112a, 113a, and 114a.

Figure 5:
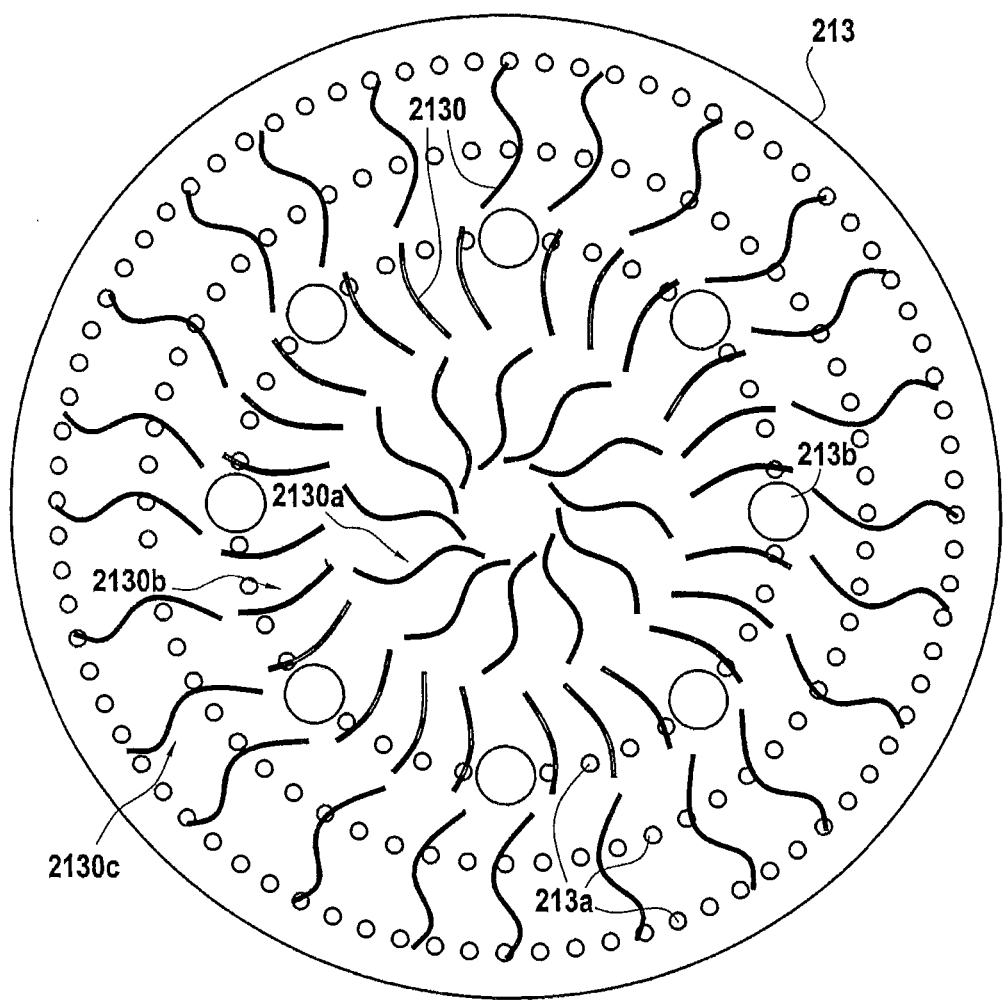
FIG. 5 is a plan view of a distribution tray of the FIG. 4 preheater chamber.

As shown in FIG. 5, the walls 2130 are arranged on the tray 213 in substantially radial directions. This radial arrangement, which is the same as that of the walls 2110, 2120, and 2140, serves to heat and to guide the gas stream penetrating into the space present between two distribution trays. In FIG. 5, the walls 2130 serve to guide and heat the gas stream penetrating between the distribution trays 213 and 214 via the perforations 213a in the tray 213.

The walls preferably present dimensions that are less than the radii of the distribution trays so as to be able to occupy the space present between the distribution trays in optimum manner. In FIG. 5, the walls 2130 are arranged radially in three series, namely a first series 2110a closest to the center of the tray 213, a second series 2130b in an intermediate portion of the tray 213, and a third series 2130c in the vicinity of the periphery of the tray 213. This radial arrangement as a plurality of series serves to increase the number of walls on going further from the center of the tray, thereby optimizing the heat exchange surface area constituted by the walls. In addition, this radial arrangement as series of walls makes it possible to have discontinuities in the flow paths for the gas stream that optimize its flow.

The walls used in the preheater chamber of the invention are made out of materials having good capacity for transferring heat by convection, such as for example graphite or a refractory metal such as stainless steel or molybdenum. The walls are preferably also made of a material that presents thermal conductivity that is greater in a direction parallel to the distribution trays than in a direction perpendicular to said perforated trays. Specifically, with such materials, anisotropic thermal conduction is defined between the distribution trays, thereby providing partial thermal decoupling between the cold portion of the installation (the bottom wall or the top wall of the installation as a function of the position of the preheater chamber) and the loading zone, while increasing the heating capacity of the preheater chamber. In particular, such materials may be graphite or a thermostructural composite material having fiber reinforcement densified by a matrix, with the fibers of the reinforcement extending for the most part in a direction parallel to the distribution trays.

As a comparative example in an installation for densification by CVI, it has been possible to reduce the height of the preheater chamber by 30% by using a preheater zone in accordance with the invention, i.e. a preheater zone having walls between the trays defining flow paths for the gas, while still obtaining performance that is equal to or better than the performance of the preheater chamber of the prior art, i.e. a chamber not having such walls between the trays, where performance is measured in terms of capacity and uniformity of gas stream heating. This reduction in the height of the preheater chamber by means of the invention gives rise to a corresponding increase in height made available to the working zone of the installation, i.e. the treatment chamber, which thus has its loading capacity increased.

The invention claimed is:

1. A thermochemical treatment installation comprising:
a reaction chamber;
at least one gas inlet; and
a gas preheater chamber situated between the at least one gas inlet and the reaction chamber, said gas preheater chamber having a plurality of perforated distribution trays held spaced apart one above another, wherein the gas preheater chamber also includes, between at least two facing perforated distribution trays of the plurality of perforated distribution trays, a plurality of walls defining flow paths for a gas stream between said plurality of perforated distribution trays, each wall of the plurality of walls extending vertically between said at least two facing perforated distribution trays, and wherein the plurality of walls comprises at least:
a first series of walls located in a center zone of each of the at least two perforated distribution trays; and
a second series of walls located in a periphery zone of each of the at least two perforated distribution trays, the first series and the second series being configured to create discontinuities in the flow paths of the gas stream.

2. An installation according to claim 1, wherein the plurality of distribution trays are disk-shaped and wherein at least some of the plurality of walls extend between said plurality of distribution trays in a radial direction.

3. An installation according claim 2, wherein a first number of walls of the second series of walls is greater than a second number of walls of the first.

4. An installation according to claim 1, wherein at least some of the plurality of walls present an undulating shape.

5. An installation according to claim 1, wherein the plurality of walls present thermal conductivity that is greater in a direction parallel to the plurality of perforated distribution trays than in a direction perpendicular to said plurality of perforated distribution trays.

6. An installation according to claim 5, wherein the plurality of walls are made of composite material having fiber reinforcement densified by a matrix, and wherein the fiber reinforcement of the composite material extends for the most part in a direction parallel to the plurality of perforated distribution trays.

7. An installation according to claim 5, wherein the plurality of walls are made of graphite. series of walls.

8. An installation according to claim 1, further comprising a loading tray present above the plurality of perforated distribution trays of the gas preheater chamber, said loading tray being supported by columns passing through the plurality of perforated distribution trays.

9. An installation according to claim 8, wherein the loading tray has a plurality of circular openings each serving to co-operate with a stack of annular fiber preforms for densifying.

10. An installation according to claim 1, further comprising a susceptor having at least one side wall surrounding the gas preheater chamber and the reaction chamber, and an induction winding suitable for heating the at least one side wall by induction.

11. An installation according to claim 1, wherein the plurality of walls further comprises:
    a third series of walls located at an intermediate portion of each of the at least two perforated distribution trays.

12. An installation according to claim 11, wherein:
    the first series of walls comprises a first number of walls;
    the second series of walls comprises a second number of walls; and
    the third series of walls comprises a third number of walls such that the second number of walls is greater than the first number of walls and the third number of walls, and the third number of walls is greater than the first number of walls.

13. An installation according to claim 11, wherein at least part of the intermediate portion is located between the center zone and the periphery zone.

* * * * *